US005649833A

United States Patent [19]

Pfeuffer et al.

[11] Patent Number: 5,649,833

[45] Date of Patent: Jul. 22, 1997

[54] CONNECTING MODULE

[75] Inventors: Reinhard Pfeuffer, Elchesheim-Illingen; Bernhard Adler, Rastatt; Hermann Kieferle, Gaggenau, all of Germany

[73] Assignee: Maquet AG, Rastatt, Germany

[21] Appl. No.: 496,081

[22] Filed: Jun. 28, 1995

[30] Foreign Application Priority Data

Jul. 4, 1994 [DE] Germany .......................... 44 23 403.1

[51] Int. Cl.[6] .................................................. H01L 21/60

[52] U.S. Cl. .................................. 439/218; 5/600; 5/611; 5/616

[58] Field of Search .................................... 439/217, 218, 439/577, 289, 700, 824; 385/16, 25; 340/686; 5/600, 601, 611, 613, 616

[56] References Cited

U.S. PATENT DOCUMENTS

| | | | |
|---|---|---|---|
| 3,066,204 | 11/1962 | Mobarry | 439/217 X |
| 4,937,482 | 6/1990 | Dohogne | 439/217 X |
| 4,938,707 | 7/1990 | Guimond et al. | 439/218 |
| 5,018,988 | 5/1991 | Kibblewhite et al. | 439/577 |
| 5,409,390 | 4/1995 | Yoshida | 439/218 |

*Primary Examiner*—Allan N. Shoap
*Assistant Examiner*—Christopher J. McDonald
*Attorney, Agent, or Firm*—McCormick, Paulding & Huber

[57] ABSTRACT

In a connecting module for the transmission of electrical energy and/or information signals between a patient support means of an operating table and a supporting apparatus releasably connectable with the patient support means, including a support apparatus module portion (42) and a patient support means module portion (44), one of the module portions (42,44) is provided with a first group of transmission elements (88,98) for the transmission of electrical energy and/or information signals and a second and a third group of complementary transmission elements (60,72) are provided in the other module portion (44,42) and are so arranged that upon connection of the patient support means with the support apparatus in a first position of the patient support means relative to the support apparatus the transmission elements (88,98) of the first group cooperate with the transmission elements (60,72) of the second group and so that in a second position of the patient support means relative to the support apparatus, which second position is rotated relative to the first position about a vertical axis, the transmission elements (88,98) of the first group cooperate with the transmission elements (60,72) of the third group.

12 Claims, 3 Drawing Sheets

CONNECTING MODULE

FIELD OF THE INVENTION

The invention concerns a connecting module for the transmission of electrical energy and/or information signals between a patient support means of an operating table and a support apparatus releasably connectable with the patient support means, the connecting module including a support apparatus module portion and a patient support means module portion.

BACKGROUND OF THE INVENTION

The patient support means of an operating table is made up of different sections which are adjustable relative to one another. The adjustment takes place with the help of motors which can be arranged in the rails of the patient support means. The patient support means is liftable from the support apparatus of the operating table and can for example be placed on a transport carriage. In this latter situation it should also be possible to adjust the sections of the patient support means. Therefore, for example, a patient can already be prepared for the operation outside of the operating room and can be put into the position necessary for the operation. For the adjustment of the sections of the patient support means the delivery of energy to the adjusting motors of the patient support means and the exchange of information signals between an electronic control inside of the patient support means and the support apparatus is necessary. Thus, the possibility should exist for the patient support means to be arranged on the support apparatus for example at two positions displaced 180° from one another relative to the support apparatus. Basically such a connection can be made using cables and plug connectors. Plug connections and cables are, however, troublesome to service and hard to clean.

The invention has as its object to provide a connecting module of the aforementioned kind which makes possible the creation of a connection for the transmission of electrical energy and/or informational signals in simple and easy ways and which also allows for different positions of the patient support means relative to the support apparatus.

SUMMARY OF THE INVENTION

The foregoing object is solved in accordance with the invention in that the patient support means module portion of a connecting module is provided with a first group of transmission elements for the transmission of electrical energy and/or information signals and in that a second and a third group of complementary transmission elements are arranged in the other module portion so that upon connection of the patient support means with the support apparatus in a first position of the patient support means relative to the support apparatus the transmission elements of the first group cooperate with the transmission elements of the second group and so that in a second position of the patient support means relative to the support apparatus, which second position is rotated relative to the first position about a vertical axis, the transmission elements of the first group cooperate with the transmission elements of the third group.

Through the provision and arrangement of the transmitting elements in accordance with the invention the patient support means can be connected with the support apparatus in at least two different positions, for example in two positions displaced from one another by 180°, and at the same time a connection for energy and signal transmission with stationarily arranged transmission elements can be made. The transmission elements for the transmission of electrical energy can, for example, be made as metallic contact elements which upon placement of the patient support means onto the supporting apparatus come into contact with one another. Further, the transmission elements for the information signals can be made to provide for a noncontact transmission wherein the information signals, for example, are transmitted in the form of electromagnetic radiation. Thus for example an infrared sender can be arranged in one module portion and an infrared receiver in the other module portion. An optical coupling can also be used which works in the visible range of the spectrum. Such transmission elements for the transmission of information signals can be arranged behind a material transparent to the involved radiation to allow for an entirely smooth outer surface which is easy to clean. The metallic contact elements for the transmission of electric drive energy for the adjusting motors inside of the patient support means can also be embedded in this material. Thereby it can be practical to make the contact elements in one of the module portions movable and to pretension them in the direction toward the rigidly standing contact elements in the other module portion so that a reliable contact condition is assured upon the moving together of the two module portions.

Preferably the first group of transmission elements are arranged in the patient support means while the second and third groups of transmission elements are provided in the support apparatus. The support apparatus can be made as the support column of an operating table as well also as a support carriage for the patient support surface.

Further features and advantages of the invention will be apparent from the claims and the following description which in combination with the accompanying drawings explain the invention in connection with an exemplary embodiment.

DESCRIPTION OF THE PREFERRED EMBODIMENT

Figure 1:
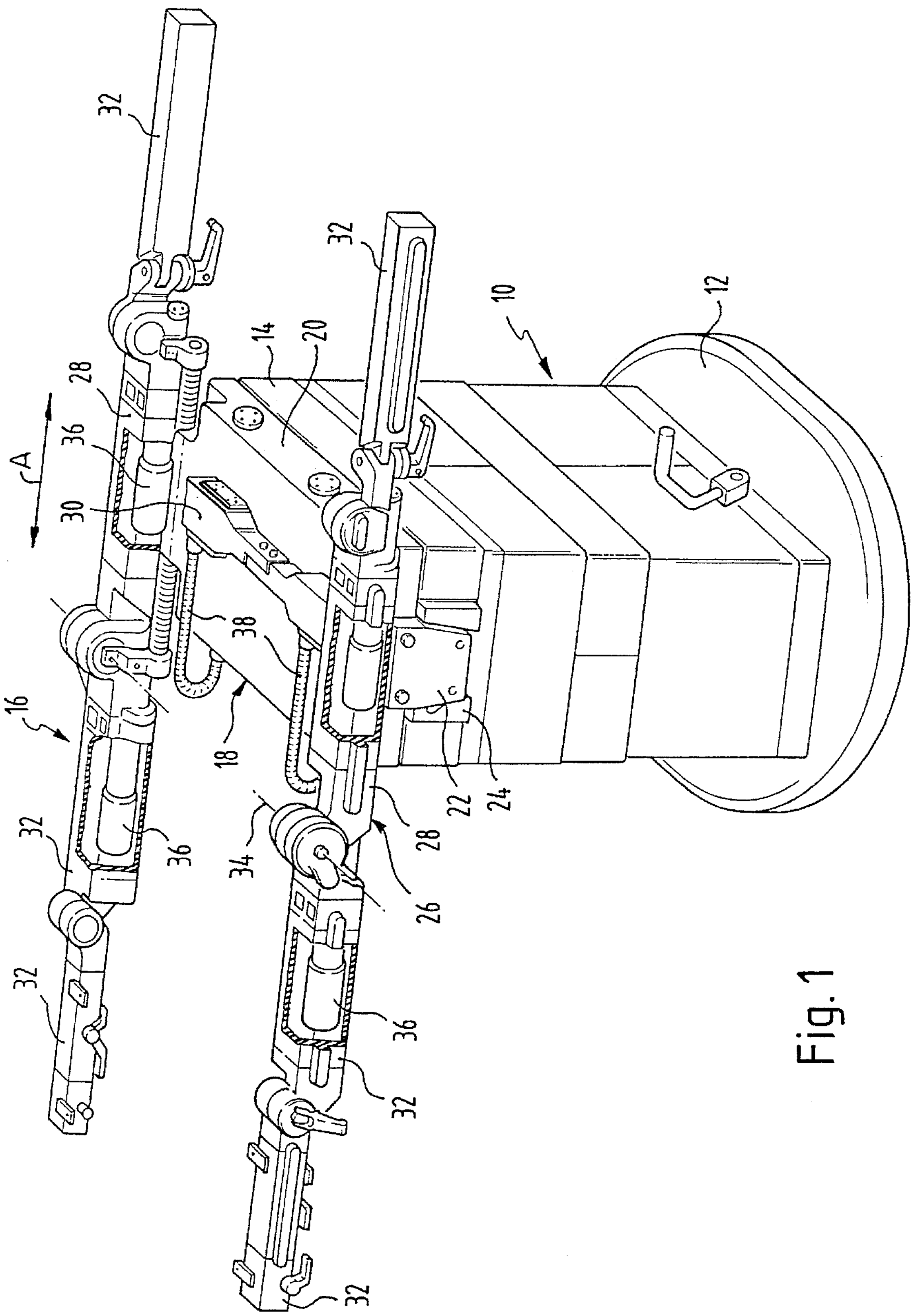
FIG. 1—a schematic illustration of an operating table, with only the side rails of the patient support means being illustrated without support plates, FIG. 2—a plan view of the support column module portion, and FIG. 3—a section through the connecting module of the invention along line III—III of FIG. 2.

In FIG. 1 the reference numeral 10 indicates the support column of an operating table which rests on a column foot 12 and has a head plate 14. A patient support means, indicated generally at 16, is connected with the head plate 14 and is shown with its cushioning removed. The patient support means 16 includes a middle section, indicated generally at 18, with a rectangular base plate 20. This base plate on each of two oppositely disposed rectangular sides is connected with a latch 22 (only one of which is seen in FIG. 1), which latches are received in corresponding recesses 24 in the head plate 14 of the support column 10 when the patient support means is anchored on the support column 10.

An H-shaped frame portion 26 is arranged on the base plate 20 which frame portion 26 can be adjusted relative to the base plate 20 in the direction of the double arrow A of FIG. 1 and which consists of two side rails 28 and an intermediate strut 30 connecting the two side rails. The side rails 32 of further patient support sections are pivotally connected to the ends of the side rails 28 so that they are adjustable about horizontal transverse axes 34. The adjustment takes place with the help of motors 36 which in the illustrated case are made as electric motors. A nonillustrated control unit is arranged inside of the base plate 20. The transmission of electric drive energy to the drive motors 36 and the transmission of information signals between the electric motors 36 and, if need be, position encoders inside of the patient support sections and the control unit arranged in the base plate 20 takes place through a cable 38 which connects the base plate 20 with the transverse strut 30.

The connecting module of the invention serves for the transmission of electrical energy and/or information signals between the base plate 20 of the middle section 18 of the patient support means 16 and the head portion 14 of the support column 10. This connecting module will now be explained with reference to FIGS. 2 and 3.

The connecting module, indicated generally at 40, includes a module portion 42 arranged in the support column head 14 and a module portion 44 arranged in the base plate 20 of the patient support section 18. The support column module portion 42 has the shape of a rectangular plate with rounded corners with a middle portion 46, which middle portion 46 is set into a complementary opening 48 in the cover plate 50 of the column head 14, and the middle portion is surrounded by a flange 52 which is threadably fixed to the cover plate 50 by screws 54. In the side of the flange 52 facing the plate 50 is formed a groove 56 surrounding the middle portion 46, in which groove a sealing ring 58 is placed. The heighth of the middle portion relative to the flange 52 is so chosen that the upper surface of the middle portion 46 is flush with the upper side of the plate 50 when the support column module portion 42 is assembled with the plate 50.

Figure 3:
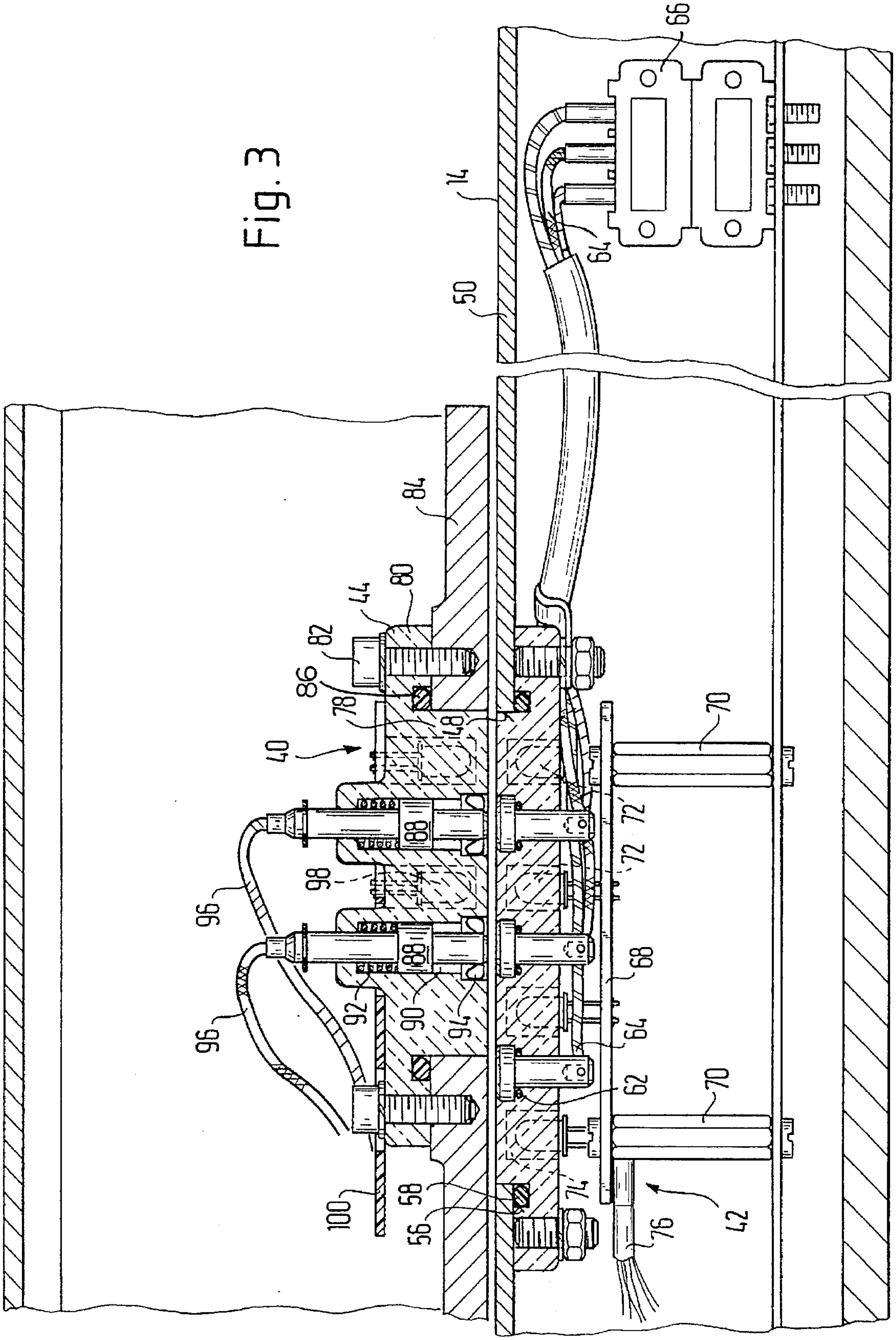

Three metallic contact elements 60 are arranged in the support column module portion 42 along the longitudinal axis of the module portion 42 at equal spacings from one another, each of which elements has a shank and a head, as shown in FIG. 3, with a sealing ring 62 surrounding the shank below the head. Each of the shanks of the contact elements 60 is connected by a conductor 64 with a plug 66.

Below the plate 46,52 is a plate 68 fastened to spacers 70 which carries in each of two rows four infrared sender/receiver elements 72. These sender/receiver elements (infrared diodes) are received in recesses 74 in the plate 46,52 which is made of a material transparent to the infrared radiation. These diodes are connected through a cable 76 to a nonillustrated control device. Whereas the three contact elements 60 serve for the transmission of electrical energy for the drive motors 36 in the patient support means 16 there takes places through the infrared diodes 72 the sending and receiving of information signals. The contact elements 60 and the infrared diodes 72 are so connected that the four left diodes 72 of FIG. 2 and the two left contact elements 60 on one hand and the four right diodes of FIG. 2 and the two right contact elements 60 on the other hand form two entirely similar groups of transmission elements for the transmission of electrical energy (contact elements 60) and information signals (infrared diodes 72). The preceding description moreover shows that the top surfaces of the support column contact module portion 42 is entirely sealed and smooth so that this upper surface can be washed with liquid cleaning material and has no nooks or depressions in which dirt can accumulate.

The patient support module portion 44 is in principle made similarly to the support column module portion 42, but contains fewer transmission elements and is therefore also smaller. It consists of a plate with a middle section 78 and a flange 80 surrounding the middle section, which flange is screwed to a bottom plate 84 of the base portion 20 by screws 82, with the connection again being sealed by a sealing ring 86. Two movable contact elements 88 are supported in the middle section 78 in positions opposite to the two right contact elements 60 of FIG. 2. Each movable contact element 88 is guided in a bore 90 and is biased by a spring 92 in the illustrated way in the direction toward the associated rigid contact element 60 of the module portion 42. The exit opening of the bore 90 is fluid tightly sealed by a sealing sleeve 94. The contact elements 88 are connected by conductors 96 with a nonillustrated control device and a distributor for the electrical drive energy.

Figure 2:
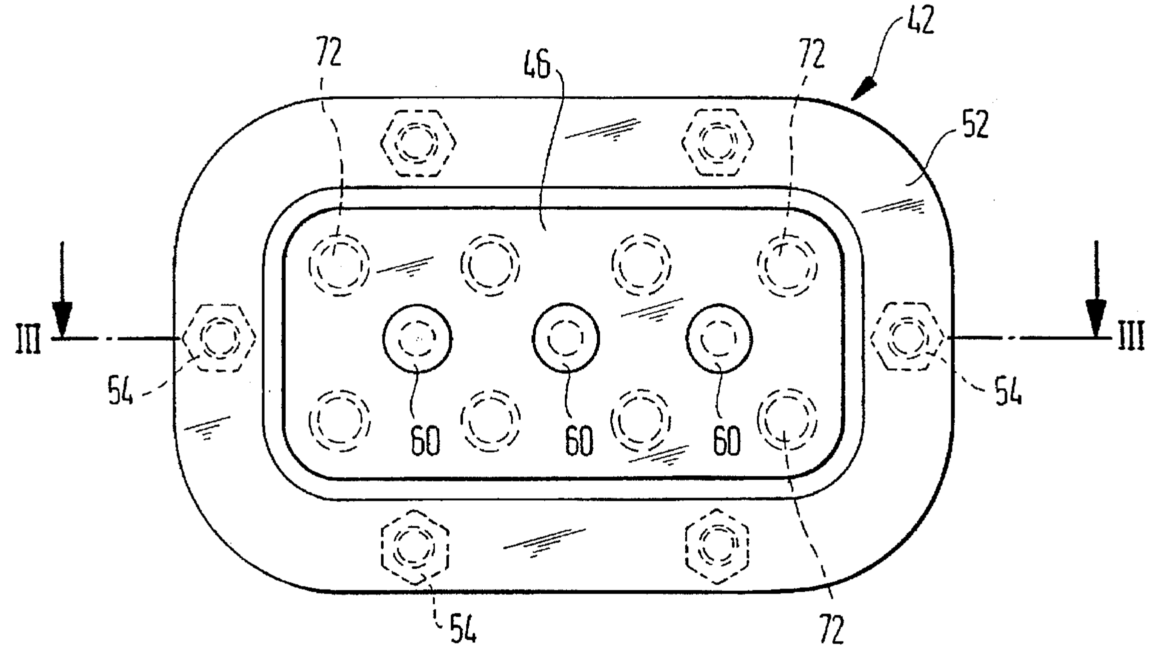

Further, four infrared diodes 98 are so arranged in the patient support means module portion 44 that they are disposed exactly oppositely to the right group of four infrared diodes 72 of FIG. 2. They are arranged on a plate 100 connected with the control device. The plate 78,80 of the patient support means module portion 44 is also so set into the bottom plate 84 of the base portion 20 that the underside of the bottom plate 84 is entirely flat. Only the tips of the movable contact elements can extend out of this bottom plate.

As will be understood, the two module portions 42 and 44 are so formed and arranged that the two module portions 42 and 44 can be connected to one another in two positions displaced from one another by 180°. In the position illustrated in FIG. 3 the movable contact elements 88 and the four infrared diodes 98 of the patient support means module portion (first group of transmission elements) cooperate with the right two contact elements 60 and a right group of four infrared diodes 72 (second group of transmission elements). If the patient support means 16 is turned relative to the support column 10, and with it also the patient support means module portion 44, relative to the support column module portion 42 by 180°, then the first group of transmission elements cooperate with the left two contact elements 60 and the left group four infrared diodes 72 illustrated in FIG. 2 (third group of transmission elements).

The preceding description shows that the connecting module of the invention makes possible a connection for the transmission of electrical drive energy and of information signals between the support column and the patient support means in two different positions of the patient support means relative to the support column, with the patient support transmission elements and the support column transmission elements upon setting of the patient support means onto the support column coming into transmitting connection with one another and with both module portions being so built into the support column and the patient support means that their outer surfaces can be cleaned without problem and offer no possibility for the accumulation of dirt. The support column module portion can also be provided on a transport carriage for the transport of the patient support means in order to supply the patient support means outside of the operating room with the energy and control information needed for the adjustment of the motors.

We claim:

1. A connecting module for the transmission of electrical signals between a patient support means (16) of an operating table and a support apparatus (10) releasably connectable with the patient support means (16), including a support apparatus module portion (42) and a patient support means module portion (44), characterized in that one of the module portions is provided with a first group of transmission elements (88,98) for the transmission of electrical signals and in that a second and a third group of complementary transmission elements (60,72) are provided in the other module portion and are so arranged that upon the connection of the patient support means (16) with the support apparatus (10) in a first position of the patient support means (16) relative to the support apparatus (10) the transmission elements (88,98) of the first group cooperate with the transmission elements (60,72) of the second group and so that in a second position of the patient support means relative to the support apparatus (10), which second position is rotated relative to the first position about a vertical axis, the transmission elements (88,98) of the first group cooperate with the transmission elements (60,72) of the third group.

2. A connecting module according to claim 1 further characterized in that the transmission elements (88,98) of the first group are arranged in the patient support means (16).

3. A connecting module according to claim 1 characterized in that the transmission elements for the transmission of electrical energy are formed as metallic contact elements (60,88).

4. A connecting module according to claim 3 characterized in that the contact elements (80) in the first module portion (42) are rigid while the contact elements (88) in the other module portion (44) are resiliently biased toward positions at which they engage the contact elements (60) of the first module portion (42).

5. A connecting module according to claim 1 characterized in that the transmission elements (72,94) for the information signals are formed for a contactless transmission.

6. A connecting module according to claim 5 further characterized in that the transmission elements (72,98) for the information signals are formed for the transmission of electromagnetic radiation.

7. A connecting module according to claim 6 further characterized in that the transmission elements (72,98) for the information signals are made from infrared senders and infrared receivers.

8. A connecting module according to claim 6 further characterized in that the transmission elements for the information signals are formed as senders and receivers of visible light.

9. A connecting module according to claim 5 further characterized in that the transmission elements (72,98) for the information signals in the case of each of the module portions (42,44) are covered by a fluid-tightly sealed transparent cover (46,78).

10. A connecting module according to claim 1 further characterized in that the patient support means module portion (44) and the support apparatus module portion (42) are connected with a control circuit associated with the patient support means and a control circuit associated with the support apparatus.

11. A connecting module according to claim 1 characterized in that the support apparatus module portion (44) is arranged on the support column (10) of an operating table.

12. A connecting module according to claim 1 characterized in that the support apparatus module portion (42) is arranged on a transport carriage for the patient support means (16).

* * * * *